(12) United States Patent
Gunawan et al.

(10) Patent No.: US 9,349,384 B2
(45) Date of Patent: May 24, 2016

(54) METHOD AND SYSTEM FOR OBJECT-DEPENDENT ADJUSTMENT OF LEVELS OF AUDIO OBJECTS

(71) Applicant: DOLBY LABORATORIES LICENSING CORPORATION, San Francisco, CA (US)

(72) Inventors: David Gunawan, Sydney (AU); Glenn N. Dickins, Sydney (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/428,419

(22) PCT Filed: Sep. 11, 2013

(86) PCT No.: PCT/US2013/059281
§ 371 (c)(1),
(2) Date: Mar. 16, 2015

(87) PCT Pub. No.: WO2014/046941
PCT Pub. Date: Mar. 27, 2014

(65) Prior Publication Data
US 2015/0228293 A1  Aug. 13, 2015

Related U.S. Application Data

(60) Provisional application No. 61/702,798, filed on Sep. 19, 2012.

(51) Int. Cl.
*G10L 21/034* (2013.01)
*G10L 21/0324* (2013.01)
(Continued)

(52) U.S. Cl.
CPC ......... *G10L 21/0324* (2013.01); *G10L 21/0272* (2013.01); *G10L 21/034* (2013.01); *H03G 3/32* (2013.01)

(58) Field of Classification Search
USPC .................................................. 704/200–230
See application file for complete search history.

(56) References Cited

U.S. PATENT DOCUMENTS 5,172,415 A     12/1992  Fosgate
5,937,377 A *   8/1999  Hardiman ........... G10L 21/0208
                                                    704/225
(Continued)

FOREIGN PATENT DOCUMENTS

GB       2289583        11/1995
WO    2007/127023       11/2007
WO    2009/011827        1/2009

OTHER PUBLICATIONS

Dickins, G. et al. "On the Potential for Scene Analysis from Compact Microphone Arrays" Proc. 52nd AES International Conference on Sound Field Control—Engineering and Perception, Sep. 2, 2013, pp. 1-10, Guildford, UK.

*Primary Examiner* — Abul Azad

(57) ABSTRACT

In some embodiments, a method for adaptive control of gain applied to an audio signal, including steps of analyzing segments of the signal to identify audio objects (e.g., voices of participants in a voice conference); storing information regarding each distinct identified object; using at least some of the information to determine at least one of a target gain, or a gain change rate for reaching a target gain, for each identified object; and applying gain to segments of the signal indicative of an identified object such that the gain changes (typically, at the gain change rate for the object) from an initial gain to the target gain for the object. The information stored may include a scene description. Aspects of the invention include a system configured (e.g., programmed) to perform any embodiment of the inventive method.

21 Claims, 3 Drawing Sheets

(51) Int. Cl.
*H03G 3/32* (2006.01)
*G10L 21/0272* (2013.01)

(56) References Cited

U.S. PATENT DOCUMENTS

| | | | |
|---|---|---|---|
| 7,508,947 | B2 | 3/2009 | Smithers |
| 7,876,914 | B2 | 1/2011 | Grosvenor |
| 7,995,732 | B2 | 8/2011 | Koch |
| 7,995,770 | B1 | 8/2011 | Simon |
| 8,068,105 | B1 | 11/2011 | Classen |
| 2004/0267387 | A1 | 12/2004 | Samadani |
| 2005/0060142 | A1 | 3/2005 | Visser |
| 2005/0281410 | A1 | 12/2005 | Grosvenor |
| 2006/0008117 | A1 | 1/2006 | Kanada |
| 2007/0100605 | A1 | 5/2007 | Renevey |
| 2009/0094029 | A1 | 4/2009 | Koch |
| 2009/0222272 | A1 | 9/2009 | Seefeldt |
| 2009/0282335 | A1 | 11/2009 | Alexandersson |
| 2010/0083344 | A1* | 4/2010 | Schildbach ............ H03G 7/007 725/151 |
| 2011/0002469 | A1 | 1/2011 | Ojala |
| 2011/0081024 | A1 | 4/2011 | Soulodre |
| 2011/0222695 | A1 | 9/2011 | Hess |
| 2012/0076305 | A1 | 3/2012 | Virolainen |
| 2012/0076312 | A1* | 3/2012 | Iyengar ................ H04R 1/1083 381/57 |
| 2012/0123769 | A1* | 5/2012 | Urata ................... H03G 3/3089 704/225 |

* cited by examiner

METHOD AND SYSTEM FOR OBJECT-DEPENDENT ADJUSTMENT OF LEVELS OF AUDIO OBJECTS

CROSS REFERENCE TO RELATED APPLICATION

This application claims priority to U.S. Provisional patent Application No. 61/702,798 filed 19 Sep. 2012, which is hereby incorporated by reference in its entirety.

BACKGROUND OF THE INVENTION

1. Field of the Invention

The invention pertains to systems and methods for controlling the levels of audio objects (indicated by an audio signal) to object-dependent target levels at object-dependent rates. Typical embodiments are systems and methods for controlling the levels of audio objects (indicated by an audio signal) at object-dependent rates, where the audio objects include voices of voice conference participants, and the object-dependent rates and/or target levels depend on stored information regarding each distinct audio object.

2. Background of the Invention

Throughout this disclosure, including in the claims, the terms "speech" and "voice" are used interchangeably, in a broad sense to denote audio content perceived as a form of communication by a human being. Thus, "speech" determined or indicated by an audio signal may be audio content of the signal which is perceived as a human utterance upon reproduction of the signal by a loudspeaker (or other sound-emitting transducer).

Throughout this disclosure, including in the claims, the expression "segment" of an audio signal assumes that the signal has a first duration, and denotes a segment of the signal having a second duration less than the first duration. For example, if the signal has a waveform of a first duration, a segment of the signal has a waveform whose duration is shorter than the first duration.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X-M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

In business meetings in which audio signals (e.g., audio signals delivered by communication systems) indicative of participant speech are reproduced, an important component of the audio processing of the signals is leveling of segments of the signals which are indicative of speech of different talkers. People speak at various levels in a meeting and it is typically necessary for an audio processing system to actively adjust the levels of different segments of an audio signal to ensure that the perceived loudness of each participant's speech is consistent.

Conventional leveling systems typically employ automatic gain control (AGC) to regulate levels. However, such systems typically have fixed time constants that govern how quickly to attenuate or increase the leveling gain. For a single talker (such as on a telephone) this may suffice. However, when multiple talkers are involved (such as in a business conference call), fixed time constants result in acoustically unnatural artifacts such as voices fading in and out due to rapid changes in level due to talker switching. Additionally, simple gain control systems can be disturbed by sudden loud activities after which time the desired signal activity or voice is attenuated until the gain again recovers, and this can be a noticeable and undesirable duration.

FIG. 1 is a block diagram of a simple conventional AGC leveling system integrated with an audio pre-processing subsystem (pre-processor 1) for pre-processing the audio signal to be leveled. Level calculation subsystem 3 performs voice detection on the pre-processed audio signal (or alternatively, on the audio signal asserted to the input of pre-processor 1) to identify at least one voice segment thereof, and for each voice segment, determines an estimated voice level for the segment. Alternatively, pre-processor 1 performs voice detection on the input audio signal to identify at least one voice segment thereof, and for each voice segment, subsystem 3 determines an estimated voice level for the segment. The leveling is achieved by determining (in subsystem 5) an updated gain for each voice segment of the pre-processed signal output from subsystem 1, and applying (in gain stage 7) the updated gain to the corresponding voice segment. Thus, stage 7 modifies each voice segment such that estimated voice level (determined in subsystem 3) for the segment is shifted to a predetermined target level at the output of stage 7. Optionally, subsystem 3 does not perform voice detection and instead determines an estimated level for each segment of the audio signal asserted to its input, and stage 7 modifies each segment such that estimated level (determined in subsystem 3) for the segment is shifted to a predetermined target level.

FIG. 2 is a block diagram of an alternative conventional leveling system which is identical to the FIG. 1 system except in that the gain to achieve the desired output voice level is applied (in gain stage 9) to the input signal asserted to pre-processor 1 (rather than to the output of pre-processor 1), creating a feedback control loop. In contrast, the FIG. 1 system (and the FIG. 3 embodiment of the inventive system, to be described below) implements open gain application at the output stage.

It is well known how to implement pre-processing (e.g., in subsystem 1 of the system of FIG. 1 or FIG. 2, or in element 21 of the FIG. 3 system to be described below) including by performing instantaneous gain control to suppress noise and enhance voice activity (a function often referred to as noise suppression or noise reduction). Conventional noise reduction typically distinguishes between voice and noise components of the input audio signal, and applies greater gain to each identified voice component than to each identified noise component.

It is also conventional to analyze (e.g., by applying statistical analysis to) an audio signal indicative of a multiple microphone soundfield capture, to segment the signal, and to identify audio objects indicated by the signal (e.g., an audio object indicated by each segment of the signal). Each segment (which may be a stream of audio data samples) may be identified as being indicative of sound emitted from a specific source or set of sources. It is conventional to determine a scene "map" (or "scene description" or "sound scene") comprising data describing each audio object identified from an audio signal (e.g., data indicating a type or source of each object, and a location or trajectory of at least one source which emits the sound comprising the object). An example of an audio object is sound emitted from a specific source (e.g., voice uttered by a specific person). It has also been proposed to use such a scene map to manipulate the soundfield. For example, U.S. Pat. No. 7,876,914, issued Jan. 25, 2011, describes generation of a modified audio signal in response to a first audio signal, where the first audio signal is indicative of a sound scene, the sound scene is indicative of multiple sources, and the modified audio signal is indicative of a virtual microphone tour along a selected path through the sound scene.

BRIEF DESCRIPTION OF THE INVENTION

In a class of embodiments, the invention is a method for adaptive control of gain applied to an audio signal, including steps of:

(a) analyzing segments of the signal to identify audio objects indicated by said signal (e.g., each of a large number of objects, which could be voices of participants in a voice conference and extraneous noises occurring during the conference), including by identifying an audio object indicated by each of the segments (for example, the audio object indicated by a segment may be identified as a first conference participant's voice, a first conference participant's voice mixed with noise, a second conference participant's voice, noise emitted by a source which is not a conference participant, noise whose source has not been identified, or some other audio object);

(b) storing information (e.g., historical data) regarding each distinct audio object identified in step (a), including an identification of the object, and a measure of level of each of at least one segment of the signal indicative of the object (for example, the identification of the object could be data identifying the object as first conference participant's voice, or data identifying the object as noise whose source has not been identified, or data otherwise identifying at least one characteristic of the object);

(c) using at least a subset of the information to determine, independently for each distinct audio object identified in step (a), a target gain and a gain change rate for reaching the target gain for the audio object; and (d) applying gain to the segments of the signal indicative of one audio object identified in step (a), such that the gain changes, at the gain change rate for said object, from an initial gain to the target gain for the object. For example, the gain may change at a fast rate for a dominant conference participant, and at a slow rate for non-dominant participant (or new object or an object identified with low confidence). Optionally, the method also includes a step of using at least some of the information stored in step (b) to determine independently a target gain for each identified object (e.g., to determine different target levels, and different target gains for reaching the target levels, for different objects). Optionally, the information stored in step (b) includes a scene description.

In another class of embodiments, the invention is a method for adaptive control of gain applied to an audio signal, including steps of:

(a) analyzing segments of the signal to identify audio objects indicated by said signal (e.g., each of a large number of objects, which could be voices of participants in a voice conference and extraneous noises occurring during the conference), including by identifying an audio object indicated by each of the segments;

(b) storing information regarding each distinct audio object identified in step (a), including an identification of the object (for example, the identification of the object could be data identifying the object as first conference participant's voice, or data identifying the object as noise whose source has not been identified, or data otherwise identifying at least one characteristic of the object);

(c) using at least a subset of the information stored in step (b) to determine, independently for each distinct audio object identified in step (a), a target gain for said object; and (d) applying gain to the segments of the signal indicative of one audio object identified in step (a), such that the gain changes from an initial gain to the target gain for the object. Different target levels, and different target gains for reaching the target levels, may be determined for different audio objects (e.g., a relatively low target gain and a relatively low target level may be determined for a noisy or nuisance object and a relatively high target gain a relatively high target level may be determined for a low-noise conference participant. Optionally, the information stored in step (b) includes a scene description.

In typical embodiments, the inventive method determines levels of audio objects of an audio signal, and the rate of gain change for the objects, based on a scene analysis approach useful for voice conferencing and other applications. Use is made of historical data collected about each audio object in the scene. In a single channel or multi-channel acoustic recording of a sound scene, it is possible to deconstruct the auditory scene into a number of audio objects using a variety of parameters. These parameters are then aggregated to make decisions relating to the changes in adaptation time constants.

Aspects of typical embodiments of the inventive method include:

use of historical data regarding an identified audio object (e.g., previous activity patterns, classifiers, and location (e.g., location in a room whose activity is captured by a microphone or microphone array, or location remote from such a room) to assign a degree of relevance (e.g., relevance to a voice conference) or inversely, a degree of nuisance (e.g., a degree to which the object detracts from or interferes with a voice conference) to a description of the object (and typically also, use of the description to determine a gain change rate for the object);

use of activity transitions (i.e., occurrences of consecutive signal segments that are indicative of different audio objects, or transitions in object characteristics) to identify object importance and/or likely transitions for object relevance and activity;

control of gain change rates (e.g., time constants) for gain application to audio objects based on degree of confidence of identification of the objects and/or conference relevance of the objects based on scene history and object activity confidence; and use of an effective set of parameters determined by scene analysis and clustering to support the leveling of signal segments which are indicative of different objects, without overspecification.

Aspects of the invention include a system configured (e.g., programmed) to perform any embodiment of the inventive method, and a computer readable medium (e.g., a disc) which stores code (in tangible form) for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and a processing subsystem that is programmed (and/or otherwise configured) to perform an embodiment of the inventive method (or steps thereof) in response to data asserted thereto.

DETAILED DESCRIPTION OF THE PREFERRED EMBODIMENTS

Many embodiments of the present invention are technologically possible. It will be apparent to those of ordinary skill in the art from the present disclosure how to implement them. Embodiments of the inventive system and method will be described with reference to FIG. 3-5.

In typical embodiments, the inventive method determines gain change rates (e.g., time constants) for audio object level adjustments with historical context. For an audio signal indicative of multiple audio objects in a scene (e.g., either a mono or spatial capture), it is typically desirable to level each audio object individually. This is especially true in teleconferencing applications where large changes in level of amplified audio signal segments, indicative of utterances by different conference participants, may be undesirable or inappropriate.

Figure 3:
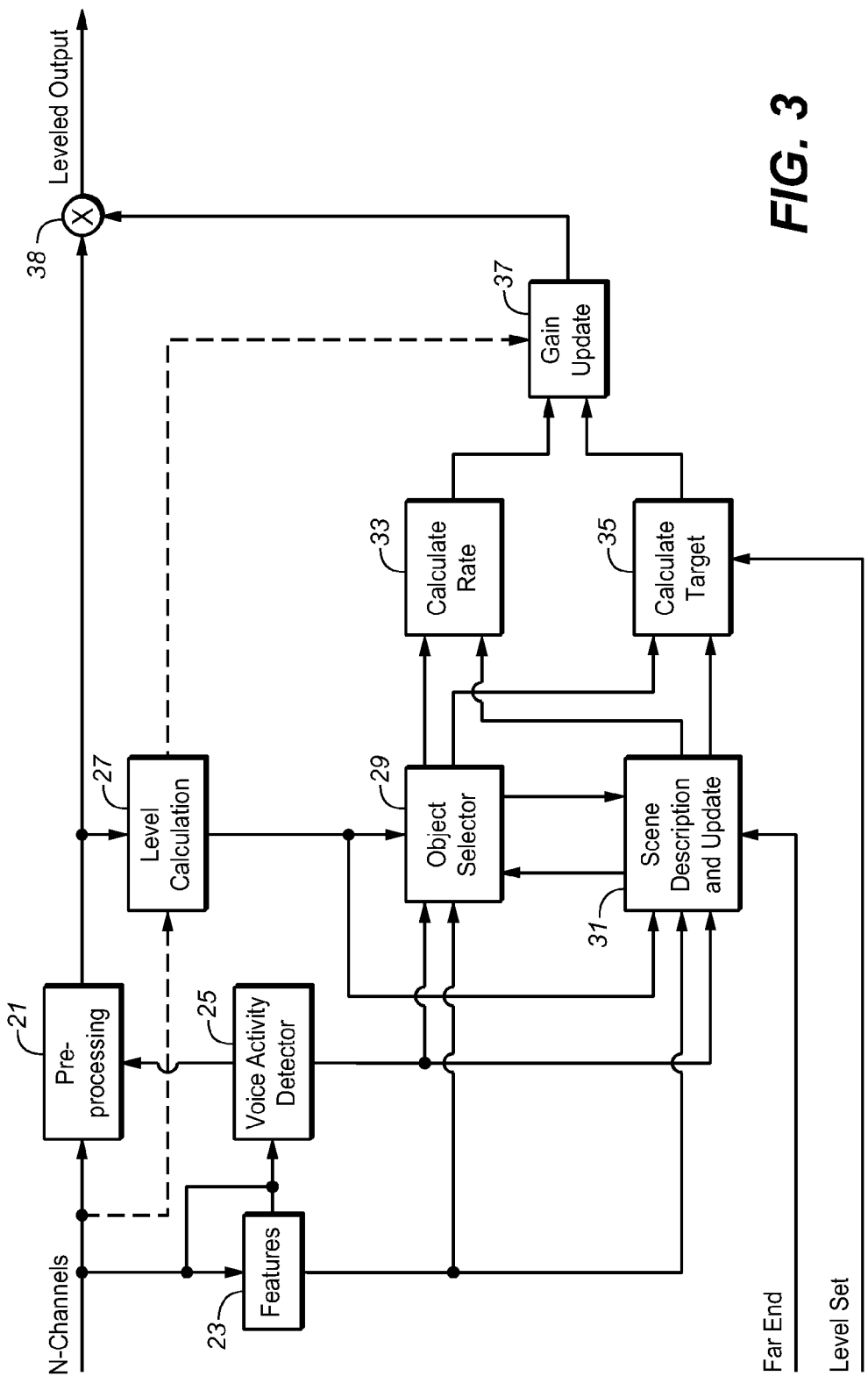
FIG. 3 is a block diagram of an embodiment of the inventive system.

FIG. 3 is an embodiment of the inventive system. The FIG. 3 system includes audio pre-processing stage 21, audio signal analysis elements 23, 25, 27, 29, and 31, target gain and target gain determining (and updating) elements 33, 35, and 37, and gain application stage 38, coupled as shown.

Audio pre-processing stage 21 (which is optionally omitted from the system) is configured to perform pre-processing of the input audio signal to be leveled. Typically, pre-processing stage 21 implements noise reduction (e.g., instantaneous gain control to suppress noise and enhance voice activity) by distinguishing voice and noise components of the input audio signal, and applying greater gain to the identified voice components than to the noise components. Pre-processing stage 21 may also implement echo reduction and/or intelligibility enhancement, and/or other conventional pre-processing on the input audio signal. Optionally, pre-processing stage 21 is omitted and elements 27 and 38 of the FIG. 3 system operate directly on the input audio signal to be leveled.

Feature identification element 23 is configured to extract a set of features from the current block of the input audio signal (or from the current block and recent historical blocks of the input audio signal). Examples of features extracted from a block of an input audio signal by typical embodiments of stage 23 include one or more of: an indication of spatial direction; estimated source distance based on statistical distribution of signal modes; specific eigenvalue ratios; diffusivity properties; spectral properties; flux; harmonicity; and pitch. The features determined by element 23 for the current block are asserted to and used by object selection stage 29 to determine the audio object to which the current block should be assigned, and are also asserted to and used by scene description element 31 to determine an updated description of the scene indicated by the input audio signal. Feature identification element 23 may be implemented in a conventional manner.

Voice activity detection stage (voice activity detector) 25 is configured to perform voice detection on the input audio signal (or alternatively on the pre-processed audio signal output from stage 21) to identify at least one voice segment thereof. For each voice segment, level calculation stage 27 determines an estimated voice level for the segment. Voice activity detector 25 may be implemented in a conventional manner.

Leveling is achieved by updating (in gain updating element 37) a gain that is applied to each segment (in gain stage 38), such that each voice segment of the pre-processed signal output from element 21 is modified (in stage 38) so that estimated voice level (determined in element 27) for the segment is shifted or asymptotically moved to a target level at the output at a target rate. Typically, the target level is determined by a predetermined target level (e.g., a predetermined target level applicable to all audio objects determined by the signal, and thus applicable to all segments or all voice segments of the signal) and by information determined by the system and stored (e.g., in object selection stage 29 and/or stage 31 of the system) regarding the audio object indicated by the segment. Typically, the system stores information (historical data) for each audio object identified (by stage 29), and different information is stored for different identified audio objects. Thus, the target level for segments indicative of one audio object may be different from the target level for segments indicative of another identified audio object. Also, the target rate for segments indicative of one audio object is determined by stored information for the object, and thus may be different from the target rate for segments indicative of another identified audio object.

Level calculation stage 27 is responsible for measuring a short term estimate of the signal level asserted at the output of pre-processing stage 21 (i.e., an estimate of signal level of each segment of the pre-processed signal). As indicated in FIG. 3, stage 27 may alternatively generate the short term signal level estimates in response to the input signal asserted to the input of pre-processing stage 21. When (as is typical), the FIG. 3 system is configured to process the input audio signal in blocks or frames of audio data values, stage 27 computes a measure (e.g., a value) indicative of the level (e.g., perceived loudness) of the current block, and typically also performs smoothing on the sequence of level measures determined from a sequence of blocks. Some possible level measure values that may be determined by stage 27 include RLB (B weighted) value, RMS value, amplitude, weighted signal level, perceptual loudness measure, and C weighted value.

In one embodiment, the audio signal input to stage 27 is a sequence of blocks of frequency domain audio data values (with a 20 ms update rate), and the time constant for smoothing of the level estimate values determined by stage 27 is 60 ms. Suitable block sizes may range from 5 ms to 200 ms, with time constants (for smoothing of level estimate values) ranging from 0 to 500 ms. It is noted that this time constant is quite short, and serves the purpose of a first level of stabilization or smoothing of the incoming instantaneous energy estimates. The estimated levels associated with any identified object are further smoothed through a later stage outlined in the subsequent text.

In a preferred embodiment, stage 27 calculates the level metric (for each block) simply as the mean power, $P_t$, over N frequency bins, with a weighting curve which de-emphasizes some of the lower and upper frequency content:

$$P_t = \frac{\alpha}{N}\sum_{n=1}^{N} w_n |X_n|^2 + (1-\alpha)P_{t-1}$$

where index t denotes the "t" th block (e.g., index t is an index of discrete time at the 20 ms interval), index n denotes the "n" th frequency bin, the parameter N is equal to 640 for a 20 ms block and a sample rate of 32 kHz, $\alpha=0.3$ for an approximate 60 ms time constant, the values $X_n$ are the frequency domain samples for the current block being processed, and The weighting values $w_n$ represent an emphasis on certain frequency components. In one embodiment $w_n=1$ for frequencies between 200 Hz and 4 kHz and $w_n=0$ elsewhere. In this way, $P_t$ is a filtered estimate of loudness based on the weighted spectral signal power.

Object selection stage (object selector) 29 is coupled and configured to determine the audio object to which the current audio block should be assigned, or alternatively, to determine that the current block should not be assigned to any object due to uncertainty or the detection of a transition.

In one embodiment, object selector 29 maps a current set of features (determined by stage 23 from a block of the input audio signal) against a parameter set maintained for each object in the current scene description (as determined by stage 31). The output of selector 29 is asserted to stage 31 for use in stage 31 to update the scene description. Selector 29 may employ a distance metric to characterize the similarity between each current set of features and the parameter set for each object in the current scene description. It is typically desirable for selector 29 to implement an amount of hysteresis, e.g., 1-2 blocks, to stabilize the object selection (by selector 29) and scene updating (by stage 31).

In some embodiments, the inventive method and system employs rigorous frameworks for both object selection and scene updating. For example, trained and online Hidden Markov Models (HMM) may be implemented for these purposes, since they are able to incorporate transition probabilities and observation uncertainties to create an object and scene trajectory. Such approaches may provide a significant benefit when there is an ability to defer or delay the decision (by stage 29) for each block. In some applications (e.g., in typical voice conferencing applications), the need for minimal delay in each decision by stage 29, and efficient implementation of the FIG. 3 system, dictates that a simple approach (e.g., the above-described simple approach) be implemented for object selection and scene updating (rather than a rigorous approach using a trained or online Hidden Markov Model).

Scene description and update stage 31 determines an updated scene description for the audio signal, which typically includes a set of audio objects indicated by the signal and an associated scene state. This description is stored (e.g., in a register or set of registers) and made available to other elements of the FIG. 3 system (i.e., to elements 29, 33, and 35). Examples of objects and associated parameters included in the scene description include one or more of: direction mean and variance (e.g., indicative of location of a conference participant who utters speech indicated by the audio signal); distance mean and variance (e.g., indicative of location of a conference participant who utters speech indicated by the audio signal); degree of diffusivity; likelihood or ratio of detected voice activity from an object; likelihood that (or another state variable related to determination that) an object is a nuisance rather than a non-nuisance object (e.g., where the non-nuisance object is speech uttered by a voice conference participant, the nuisance might be typing or other background noise present during the voice conference along with speech uttered by conference participants, or activity that appears to be unrelated in timing and therefore not of interest to the conference activity at large); last time active; relative participation in local scene; relative participation in a voice conference; classification as desirable or undesirable object; and estimated level of voice activity from the object (e.g., as determined by stage 27 for a segment of the audio signal determined by stage 29 to be indicative of the object).

Given that the selection of an object has occurred in a previous segment of the audio signal, the updating of the scene by stage 31 is typically a recursive update of various statistics and likelihood estimates determined by stage 31. Typically, updating of statistics (associated with a scene description) is performed with a time constant of on the order of 1 to 5 seconds to provide a suitable stability in parameter estimates, noting that aggregated audio segment length associated with any object of interest in a conference typically exceeds this duration. As mentioned previously, this second stage of parameter smoothing is used in conjunction with the short time constant initial smoothing of instantaneous parameters, such as the power $P_t$ detailed previously.

Object selector 29 typically outputs values indicative of a current object (e.g., a value "i") for the current block and the confidence (e.g., a value "$c_i$") which the object identification has been made.

Stage 35 is coupled and configured to determine a target output level, $P_{target}$, and a target gain, $G_{target}$, for each object that has been identified by selector 29. In typical implementations, stage 35 updates a target output level, $P_{target}$, for each object (i.e., for the "j" th object identified by stage 29, referred to below as object "j") in a manner determined by the current complete scene ("Scene") that has been constructed (by stage 31) and the current description (most recently updated by stage 29 and/or stage 31) of the object:

$$P_{target} = f(\text{Scene}, j)$$

Without any loss of generality, we define $P_{target}=1$ as the target level for a desired object (e.g., a conference participant's voice), with other objects having nuisance, non-voice or low confidence properties being given target levels less than one.

Given the current target level, $P_{target}$, for an object, stage 35 determines a current (updated) value of the target gain, $G_{target}$, which should ultimately be applied by 38 for the object. In typical implementations, the signal level measure (generated by stage 27) is in the power (signal squared) domain, and the target gain is:

$$G_{target} = (P_{target}/P_{object\,i})^{1/2}$$

where $P_{target\,i}$ is the target level (determined by stage 35) for the object indicated by the current block (the "i"th block), and $P_{object\,i}$ is the current level (determined by stage 27) for the object.

More generally, the target gain for an object is a function of: the target level (determined by stage 35) for the object as updated in response to the most recent block indicative of the object; the updated scene description determined by stage 31 (e.g., a set of values "SceneAnalysisState" indicative of aspects relating to the auditory scene (e.g., number of participants in a conference)); and updated information regarding the object itself (e.g., a set of values "CurrentObject" indicative of parameters (e.g., RMS level distribution) relating to the object). Typically, the set of values "CurrentObject" includes the current level (determined by stage 27) for the object.

Stage 33 is coupled and configured to determine (and to update) a rate, τ, at which the gain (most recently determined by stage 37) for each object (identified by selector 29) should be changed to reach the target gain determined by stage 35 for the object. The target gain for an object will in turn depend on the current level (determined by stage 27) of the object. The gain change rate for an object (which may be a time constant, and thus is sometimes referred to herein as a time constant) is typically updated (for determining the gain to be applied to the current block indicative of the object) in a manner dependent on the updated scene description ("Scene"), updated information regarding the object (the "i"th object, so that the updated information is referred to as "i"), and the confidence, c, with which the current block has been identified as being indicative of the object:

$$\tau = g(\text{Scene}, i, c)$$

In some embodiments, the gain change rate for an object is also dependent on the target gain, $G_{target}$, for the object and the current gain, G (e.g., to allow for asymmetry of upward gain increases to a target versus downward gain decreases to a target) for the object:

$$\tau = g(\text{Scene}, G_{target}, G, i, C).$$

The gain change rate for an object may depend on the importance of the object, the confidence that it is active, and the classification of the object (e.g., whether the object is classified as a nuisance). Typically, the rate is expressed as a time constant, τ, or alternatively as a slew rate, d, having units of dB/sec.

The gain rate (determined by stage 33) for an object is a function of the updated scene description determined by stage 31 (e.g., a set of values "SceneAnalysisState" indicative of aspects relating to the auditory scene (e.g. number of participants in a conference)); and updated information regarding the object itself (e.g., a set of values "CurrentObject" indicative of parameters (e.g., RMS level distribution) relating to the object). Typically, the set of values "CurrentObject" for an object includes the current level (determined by stage 27) for the object.

Stage 37 is configured to determine an updated gain for an object and to assert a control value to gain stage 38 to cause the updated gain to be applied by stage 38 to the current block (which comprises audio data indicative of the object). The updated gain depends on the current gain, G, for the object, the target gain, $G_{target}$, for the object, and the rate (e.g., time constant, τ) at which gain is permitted to change to reach the target gain for the object. The gain update can be a recursive or progressive update of the current gain toward the target gain for the relevant object.

In typical operation, the gain applied in stage 38 varies continuously (not discontinuously). Thus, in periods during which the system applies gain to audio data which have not been identified as being indicative of an audio object, a typical implementation of the system operates as a traditional AGC system. In periods in which such typical system applies gain to audio data which have been identified as being indicative of an object, and a target gain and gain change rate have been determined for the object, the gain applied by stage 38 of the typical system moves toward the target gain for the object at the gain change rate for the object (or stays at the target gain if the gain has already reached said target gain). At a transition between processing (by the typical system) of audio data indicative of a first object to processing (by the typical system) of audio data indicative of a second object, the gain applied by stage 38 of the typical system moves (from the gain applied by stage 38 just before the transition) toward the target gain for the second object at the gain change rate for the second object (or the gain stays at the target gain for the second object if the gain happens to match said target gain for the second object).

More generally, in typical implementations of the inventive system, there is a transition period in which the system processes a new segment of audio data but has not identified an audio object indicated by the segment (e.g., a period in which the system has recognized that the incoming content should no longer be attributed to last active object, but has not identified a known or new object as being indicated by the segment). During such a transition period, the system could maintain the present gain (or gain trajectory) or could start tracking with conventional AGC rates against input. Typically, it is preferred to implement the first of these two options for transition period operation. Once a new object state has been decided, some embodiments of the inventive system either match to a previously identified object of the current scene (e.g., use known information regarding an entire scene to set a target gain and gain change rate for the selected object), or make a decision that the new object state is indicative of a new (not previously identified) object and operate in a conventional AGC (slower) mode until a target gain and gain change rate can be determined for the new object. Typically, the system always operates such that the applied gain changes smoothly (toward a target).

The FIG. 3 system is an example of an embodiment of the inventive system for adaptive control of gain applied to an audio signal, said system including:

a gain stage (stage 38) coupled and configured to apply gain to the signal, including by applying different amounts of gain to different segments of the signal;

a signal analysis stage (elements 27, 29, and 31, and optionally also one or both of elements 23 and 25) coupled and configured to analyze segments of the signal to identify audio objects indicated by said signal, including by identifying an audio object indicated by each of the segments, wherein the signal analysis stage is configured to store information regarding each distinct identified audio object, said information including an identification of the object and a measure of level of each of at least one segment of the signal indicative of the object; and a gain determination stage (elements 33, 35, and 37) coupled to the gain stage and to the signal analysis stage and configured to determine, independently for said each distinct identified audio object and in response to at least a subset of the information, a gain change rate for reaching a target gain for said audio object.

The FIG. 3 system is also an example of an embodiment of the inventive system for adaptive control of gain applied to an audio signal, said system including:

a gain stage (stage 38) coupled and configured to apply gain to the signal, including by applying different amounts of gain to different segments of the signal;

a signal analysis stage (elements 27, 29, and 31, and optionally also one or both of elements 23 and 25) coupled and configured to analyze segments of the signal to identify audio objects indicated by said signal, including by identifying an audio object indicated by each of the segments, wherein the signal analysis stage is configured to store information regarding each distinct identified audio object, said information including an identification of the object; and a gain determination stage (elements 33, 35, and 37) coupled to the gain stage and to the signal analysis stage and configured to determine, independently for said each distinct identified audio object and in response to at least a subset of the information, a target gain for said audio object.

In some embodiments, the inventive method and system for leveling audio objects aggregates historical data indicative of audio objects, updates the historical data over time, stores the updated historical data, and uses the updated historical data to implement leveling. Historical data (extracted from an audio signal) can be, or can be used to determine, at least one data structure (data having a specific order, or organized in a specific way) indicative of at least one feature of each of at least one audio object in a sound field (e.g., one such data structure may consist of data indicative of the mean and variance of each of a number of features of an audio object). Each such data structure may vary over time (e.g., it may be updated in response to each update of stored historical data).

For example, each audio object typically has associated features which vary over time with some mean and variance. In one dimension, this variability defines a region of numbers over a line. In multiple dimensions, there is a region which defines the object based on the mean and variance of each of one or more features of the object. So, some embodiments of the invention could determine a time-varying data structure (which could be referred to as a "postcode") which is indicative of the mean and variance of each of one or more features of an audio object, and spans or occupies a region (a time-varying region) in some q-dimensional space (where q is the number of features). Other data structures (e.g., time-varying data structures) are determined in other embodiments of the invention, such that each data structure provides a unique signature by which the inventive system can determine which object is currently indicated by a segment of an audio data stream.

One or more data structures (e.g., postcodes) indicative of one or more audio objects, and/or updated historical data indicative of one or more audio objects, can be included (e.g., by stage 31 of the FIG. 3 system) in an updated scene description that is stored (e.g., in one or more registers within stage 31, for use by other elements of the FIG. 3 system). The historical data (and/or data structures) can be used to build a statistical model of each audio object from which future observations can be quickly classified (e.g., by stage 29 of the FIG. 3 system) as previously defined objects or new (not previously defined) objects. The historical data (and/or data structures) may include values that relate to observable parameters such as (but not limited to) direction of arrival, diffusivity, levels, and so on, or they may relate to a higher dimensional representation of the sound field. Regardless of its content, the historical data and/or each data structure can provide a succinct descriptor to classify an audio object in the sound field.

An example of a data structure associated with (and defining) an audio object (in a scene description) is a set of values indicative of the following contextual data for the object: a first set of parameters relating to physical characteristics of the object, typically estimated from the input signal (from one or more microphones) at a time instant. These parameters are adaptively updated during identified activity of the object, and are utilized in the instantaneous decision regarding the current active object. Examples of such parameters include the absolute signal level, spectral characteristics, approximate source direction and distance measures such as diffusivity or direct to reverberant ratio. It is noted that the direction measure is applicable for an input having more than one signal or microphone available; and a second set of parameters relating to statistics that are gathered from the observed identified activity of a given object. These parameters may include the following contextual data for the object: the degree of confidence (e.g., 80% or 50%) with which the object is classified as a voice; the degree of confidence (e.g., 10% or 70%) with which the object has been observed to be indicative of a nuisance activity (e.g., typing or other non-voice background noise); direction of arrival; diffusivity (distance); and the percentage of time (during a conference) in which the object has been active (i.e., the percentage of blocks of audio data, indicative of content of a conference, which are classified as audio produced by the object).

Figure 1:
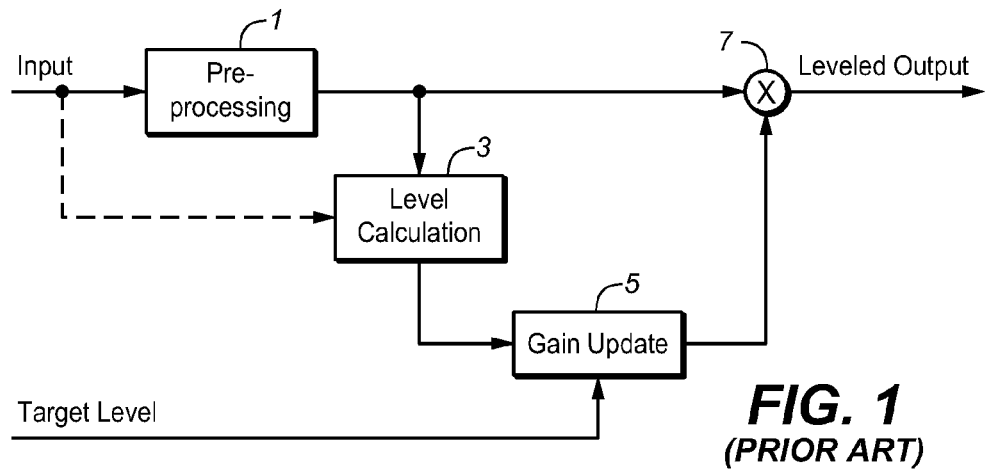
FIG. 1 is a block diagram of a conventional AGC leveling system.
Figure 2:
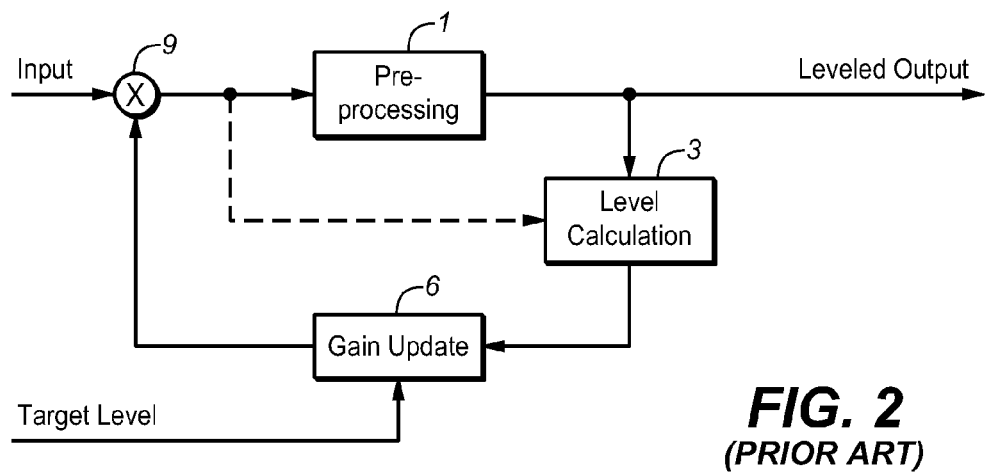
FIG. 2 is a block diagram of another conventional AGC leveling system.

Thus, stage 31 of FIG. 1 could store (and provide to stage 29) a set of data structures indicative of objects (where the objects are in turn indicated by, and determined from, the audio signal to be leveled). For example, the set could include a first data structure (e.g., an approximate 0 degree azimuth, −30 dB mean level object having historical voice with 80% confidence; nuisance with 10% of relative activity; and 30% conference participation) indicative of a first conference participant, and a second data structure (e.g., an approximate 90 degree azimuth, −50 dB mean level object having historical voice with 50% confidence; nuisance with 80% confidence; and 10% conference participation) indicative of a nuisance. Then, in response to new observation by stage 29 (i.e., in response to identification by stage 29 that a new block is indicative of a source with 10 degrees azimuth and an instantaneous level of −25 dB with a high probability of voice), stage 29 could classify the new block, with reasonable confidence, as voice uttered by the first participant.

The step of identifying an audio object (e.g., as implemented by object selector 29 of FIG. 3) during performance of some embodiments of the invention can include a step of classifying a new observation as an existing audio object, or initializing a new audio object model (and classifying the observation as a new audio object) if no match to an existing object is found. Having associated an observation with an audio object, rates for changing gains to be applied to audio objects may be adaptively determined (e.g., in stage 33 of the FIG. 3 system) based on various contextual historical data regarding each distinct one of the audio objects. It is noted that there may also be a confidence to which the instantaneous classification is made, and that this confidence will quickly increase where the same instantaneous decision is made for several sequential frames. The historical data is generated (e.g., in stages 27, 29, and 31 of the FIG. 3 system) and stored (e.g., in registers in one or both of stages 29 and 31 of the FIG. 3 system).

In addition to determining a data structure (e.g., a postcode) of an audio object, historical data (e.g., stored in stage 31 of the FIG. 3 system) can also inform the inventive system (e.g., stages 33, 35, and 37 of the FIG. 3 system) of the nature of the audio object. For example, the historical data may indicate that the object is a stationary noise source or a person speaking, and the proportion of a conversation to which the object (assuming it is person) contributed, and whether the object generated a lot of noise that is potentially distracting. The historical data (and/or at least one data structure determined thereby) may be useful in determining rates for changing gains to be applied to (e.g., leveling time constants for) specific audio objects in a scene. The historical data, for example, may include the aggregated statistics as mentioned above, such as the relative percentage or confidence that the object has been voice activity, and the relative percentage of activity of that object that has been identified as potentially of a nuisance in nature.

A data structure indicative of an audio object (and/or historical contextual data concerning the object) can be used to classify a current observation as a specific audio object, and can be used to determine the target gain and gain change rate (e.g., time constant) that should be used for the current object. For example, if one object is a person who has dominated a meeting with respect to talk time, the adaptation gain change rates (e.g., time constants) may be set (e.g., by stage 33 of the FIG. 3 system) so that the system quickly adapts (to the target level) the level of each block of the audio signal that is observed to have a data structure which matches a stored data structure indicative of the person. Conversely, if an object is a person has historically produced a lot of disruptive noise, gain change rates for causing slower gain change may be used (e.g., adaptation time constants may be set by stage 33 of the FIG. 3 system so that the system slowly adapts (to the relevant target level) the level of each block of the audio signal that is observed to have a data structure which matches a stored data structure of the person). Thus, the inventive system may implement logic to determine adaptation gain change rates (e.g., time constants) for an object based on historical and contextual data. These time constants determine the rate that the level of the object reaches the target level for the object.

One exemplary embodiment of the inventive method begins with spatial capture of an auditory scene using a microphone array. At each of a sequence of time instants (e.g., once per each block of captured audio data), parameters are estimated from the captured audio. These may include RMS levels, spatial direction of arrival, spatial diffusivity, voice activity estimate, noise spectra, and/or other parameters. One of the parameters determined for each block of audio data must indicate or determine the level of an object determined by the block. Other contextual object parameters may include whether the object is voice or noise, whether the object is a nuisance, what proportion of a conversation is person contributing to, and/or other parameters.

Clustering algorithms are then applied to the parameters (e.g., at least one Gaussian Mixture Model (GMM), or at least one Hidden Markov Model (HMM), or at least one Support Vector Machine (SVM)), and the auditory scene is segmented into clusters of audio objects. The parameters may determine a region in an n-dimensional space (where n is some integer) for each different audio object.

At each time instant, a parameter set is calculated for the input (e.g., the current block of audio data) and a distance metric calculated in the space of appropriate classification features determines whether the input is classified as belonging to one of the known objects. If the input is further than the maximum allowable distance from each known object, a new object may be created and the input may be classified as said new object. If the probability of the input being matched to a known model is sufficiently high, the input parameters are permitted to update the object model. The probability of the input being matched to a known model is indicative of the confidence of a present instantaneous classification from the scene.

Given these object parameters and the state of the complete auditory scene (e.g., how many people in a conversation), rates of gain change (e.g., time constants) are calculated for each object. This determines the rate at which the gain (applied to the signal determining each current object) is allowed to change to level the current object to a target gain. The target gain is determined by using the object parameters, the state of the auditory scene, and the target output level. The rate of gain change for the object and the target gain are then used to determine the actual gain applied to the relevant segment (e.g., block) of the input signal.

In some embodiments of the inventive system, the gain determining subsystem is configured to implement a gain limiting function (e.g., a rapid overriding limiting function) to prevent the leveled output of the system's gain stage from exceeding a predetermined maximum level. For example, in an implementation of the FIG. 3 system, gain determining stage 37 is coupled to receive the output of stage 27 (as indicated by a dashed line between stages 27 and 37 in FIG. 3). In this exemplary system, stage 37 is configured to implement a rapid overriding limiting function as follows. When stage 37 determines that the level of a segment (e.g., a block) of the audio signal being leveled exceeds a predetermined threshold value, stage 37 causes the gain applied to the segment to be rapidly reduced to a sufficiently low level to prevent the output of gain stage 38 from exceeding a predetermined maximum level. This rapid gain limiting operation overrides the normal operation that the system had been performing immediately prior to identification of the excessively loud segment.

An example of operation of an embodiment of the inventive system (system S of FIG. 4) which implements such a rapid overriding limiting function will be described with reference to FIGS. 4 and 5.

Figure 4:
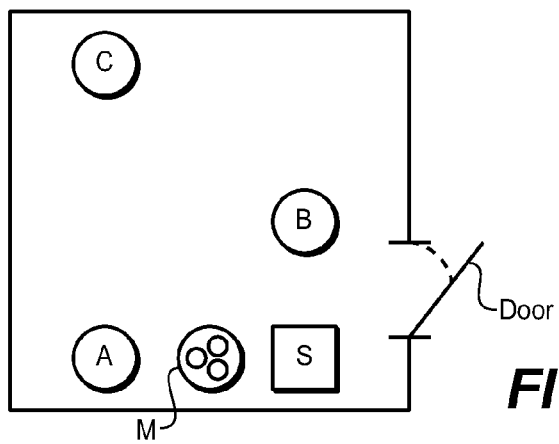
FIG. 4 is a diagram of a room including a microphone array, an embodiment of the inventive system, and three conference participants.

FIG. 4 is a diagram of a room including a door (Door), an embodiment of the inventive leveling system (system S), and a microphone array (M) coupled to system S. During a voice conference in which persons A, B, and C participate, array M captures the acoustic output of participants A, B, and C, and asserts an audio signal indicative of this sound to system S.

System S has the architecture shown in FIG. 3, and its gain determining stage (stage 37, coupled to receive the output of stage 27) is configured to implement a rapid overriding limiting function. The upper graph in FIG. 5 is an example of the gain determined by stage 37 (and asserted to the system's gain stage 38) in response to segments of the audio signal which are indicative of the sequence of audio objects indicated in the third graph from the top (labeled "Who") of FIG. 5. The second graph from the top (labeled "OBJ SEL" to denote "audio object selection") of FIG. 5 indicates segments of the audio signal which the system identifies as being indicative of this sequence of objects.

Figure 5:
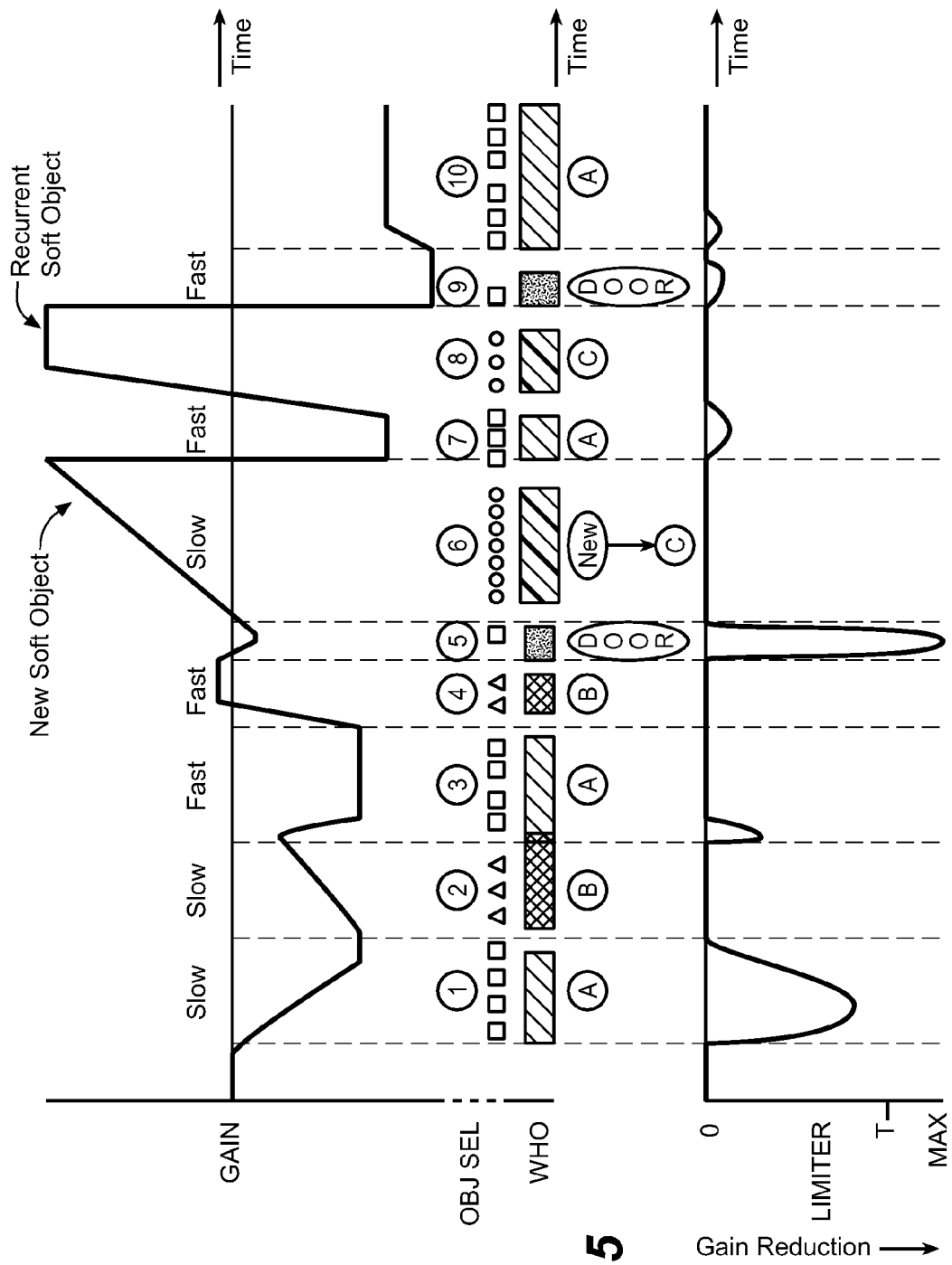
FIG. 5 is a set of graphs indicating signals generated during an example of operation of an implementation of the system of FIG. 4.

The sequence of audio objects indicated in FIG. 5 consists of: object 1 (voice uttered by participant A during the first four signal segments shown in the OBJ SEL graph); then, object 2 (voice uttered by participant B (during the next three signal segments shown in the OBJ SEL graph); then, object 3 (voice uttered by participant A during the next four segments); then, object 4 (voice uttered by participant B during the next two segments); then, object 5 (a slam of the door ("Door") during the next segment); then, object 6 (voice uttered by a new participant, initially unidentified, but then identified rapidly to be participant C, during the next seven segments); then, object 7 (voice uttered by participant A during the next three segments); then, object 8 (voice uttered by participant C during the next three segments); then, object 9 (another door slam during the next segment); and finally, object 10 (voice uttered by participant A during the next six segments).

The bottom graph (labeled "limiter") of FIG. 5 indicates performance of the system's rapid overriding limiting function. At points at which the gain reduction indicated by the graph has rate greater than the indicated threshold value T, the overriding limiting function overrides stage 37's normal mode of operation and rapidly reduces the gain applied (to the current segment) to prevent the output of gain stage 38 from exceeding the predetermined maximum level. At points at which the gain reduction indicated by this graph has rate less than the indicated threshold value, T (e.g., where the rate is equal to 0), the system's rapid overriding limiting function is either disabled (since the level of a segment does not exceed a predetermined threshold value) or stage 37 operates in its normal mode (with a secondary contribution from the rapid overriding limiting function) to determine the gain to be applied to the current segment. The distance (below the horizontal axis) of the curve shown in the graph indicates the rate at which overriding limiting function contributes to reduction of the gain applied to the current segment (the rate at which the overriding limiting function reduces the gain depends on the amount by which the level of a segment exceeds the predetermined threshold value, and the system is also configured to prevent the overriding limiting function from actually overriding stage 37's normal mode of operation under some operating conditions).

In response to object 1 (which has a relatively loud level since participant A is close to the microphone array), stage 37 determines that the gain to be applied by stage 38 (to segments indicative of the object) should be slowly reduced. The example assumes that object 1 has been identified with low confidence, and that, although the levels of the segments corresponding to object 1 are above the predetermined threshold value, the overriding limiting function makes only a secondary contribution to gain reduction determined by stage 37's normal mode of operation during leveling of object 1 (since levels of the segments corresponding to object 1 are only slightly above the predetermined threshold value). Stage 37, in its normal mode of operation (with a secondary contribution from the overriding limiting function), slowly reduces the gain to be applied by stage 38 for the segments corresponding to object 1 (since the object has been identified with low confidence), toward the target gain for object 1.

In response to object 2 (which has a relatively quiet level since participant B is not close to the microphone array), stage 37 determines that the gain to be applied by stage 38 (to segments indicative of the object) should be slowly increased. The example assumes that object 2 has been identified with low confidence, and that the levels of the segments corresponding to object 2 are below the predetermined threshold value so that the overriding limiting function is disabled. Thus, stage 37 in its normal mode of operation slowly increases the gain to be applied by stage 38 for the segments corresponding to object 2 (since the object has been identified with low confidence), toward the target gain for object 2 (which may be the same as the target gain for object 1 at this point during the conference).

In response to object 3 (which has a relatively loud level since participant A is close to the microphone array), stage 37 determines that the gain to be applied by stage 38 (to segments indicative of the object) should be rapidly increased. The example assumes that object 3 has been identified (as an utterance by participant A) with high confidence (using the stored scene description and stored information regarding participant A, which are available since this object is not the first utterance by participant A). The example also assumes that, although the levels of the segments corresponding to object 3 are above the predetermined threshold value, the overriding limiting function makes only a secondary contribution to gain change determined by stage 37's normal mode of operation during leveling of object 3 (since levels of the segments corresponding to object 3 are only slightly above the predetermined threshold value). Stage 37, in its normal mode of operation (with the secondary contribution from the overriding limiting function), rapidly increases the gain to be applied by stage 38 for the segments corresponding to object 3 (since the object has been identified with high confidence) until it matches the target gain for object 1, and then keeps the gain at such target gain level.

In response to object 4, stage 37 determines that the gain to be applied by stage 38 (to segments indicative of the object) should be rapidly increased. The example assumes that object 4 has been identified with high confidence (as an utterance by participant B) with high confidence (using the stored scene description and stored information regarding participant B, which are available since this object is not the first utterance by participant B). The example also assumes that the levels of the segments corresponding to object 4 are below the predetermined threshold value so that the overriding limiting function is disabled. Thus, stage 37 in its normal mode of operation rapidly increases the gain to be applied by stage 38 for the segments corresponding to object 4 (since the object has been identified with high confidence) until it matches the target gain for object 4, and then keeps the gain at such target gain level.

In response to object 5 (a door slam), stage 37 determines that the gain to be applied by stage 38 (to segments indicative of the object) should be rapidly decreased, to prevent the output of gain stage 38 from exceeding the predetermined maximum level. The example assumes that the level of the segment corresponding to object 5 is above the predetermined threshold value, so that the overriding limiting function overrides stage 37's normal mode of operation during leveling of object 5.

In response to object 6 (which has a relatively quiet level since participant C is far from the microphone array), stage 37 determines that the gain to be applied by stage 38 (to segments indicative of the object) should be slowly increased. The example assumes that object 6 is initially unidentified and then is identified with low confidence, and that the levels of the segments corresponding to object 6 are below the predetermined threshold value so that the overriding limiting function is disabled. Thus, stage 37 in its normal mode of operation slowly increases the gain to be applied by stage 38 for the segments corresponding to object 6 (since the object is initially unidentified and then identified with only low confidence), toward the target gain for object 6 (which may be the same as the target gain for object 1 at this point during the conference).

In response to object 7 (which has a relatively loud level since participant A is close to the microphone array), stage 37 determines that the gain to be applied by stage 38 (to segments indicative of the object) should be rapidly decreased. The example assumes that object 7 has been identified with high confidence (since it is not the first utterance by participant A), and that, although the levels of the segments corresponding to object 7 are above the predetermined threshold value, the overriding limiting function makes only a secondary contribution to gain change determined by stage 37's normal mode of operation during leveling of object 7. Instead, stage 37, in its normal mode of operation (with the secondary contribution from the overriding limiting function), rapidly decreases the gain to be applied by stage 38 for the segments corresponding to object 7 until it matches the target gain for object 7, and then keeps the gain at such target gain level.

In response to object 8, stage 37 determines that the gain to be applied by stage 38 (to segments indicative of the object) should be rapidly increased. The example assumes that object 8 has been identified with high confidence (since it is not the first utterance by participant C), and that the levels of the segments corresponding to object 8 are below the predetermined threshold value so that the overriding limiting function is disabled. Thus, stage 37 in its normal mode of operation rapidly increases the gain to be applied by stage 38 for the segments corresponding to object 8 (since the object has been identified with high confidence) until it matches the target gain for object 8, and then keeps the gain at such target gain level.

In response to object 9 (a second door slam), stage 37 determines that the gain to be applied by stage 38 (to segments indicative of the object) should be rapidly decreased, to prevent the output of gain stage 38 from exceeding the predetermined maximum level. The example assumes that the level of the segment corresponding to object 9 is above the predetermined threshold value but that the system has used stored information regarding characteristics of a door slam to recognize the source (a "door slam" object) of the current audio, and has determined that the gain for this object should be rapidly reduced (by stage 37 in its normal mode of operation). Thus, the overriding limiting function makes only a secondary contribution to rapid gain reduction determined by stage 37's normal mode of operation during leveling of object 9.

In response to object 10, stage 37 determines that the gain to be applied by stage 38 (to segments indicative of the object) should be rapidly increased. The example assumes that object 10 has been identified with high confidence (since it is not the first utterance by participant A), and that, although the levels of the segments corresponding to object 10 are above the predetermined threshold value, the overriding limiting function makes only a secondary contribution to gain change determined by stage 37's normal mode of operation during leveling of object 10. Thus, stage 37 in its normal mode of operation (with the secondary contribution from the overriding limiting function) rapidly increases the gain to be applied by stage 38 for the segments corresponding to object 10 (since the object has been identified with high confidence) until it matches the target gain for object 10, and then keeps the gain at such target gain level.

In the FIG. 5 example, for each unidentified object (or each object identified with low confidence), the system moves the applied gain slowly toward a target gain for the object, and thus moves the output signal level slowly toward a desired value (e.g., $P_{target}=1$). For an object that has been identified with high confidence (using stored information regarding the scene and the source corresponding to the object), the system much more rapidly adopts the stored target gain specific for that particular object, and thus moves the output signal level rapidly toward a desired value (e.g., $P_{target}=1$). In response to an unknown loud object (e.g., a door slam) having sufficiently high level, the system operates in its rapid overriding limiting mode to prevent the output from exceeding a predetermined level.

The rate at which the gain for an object is moved toward the target gain for the object can depend on stored contextual object data (e.g., when the rapid overriding limiting mode is disabled, and the system operates in its normal mode). For example, the system may increase the rate at which a conference participant's voice is leveled in response to information which the system has acquired (e.g., the participant's dominance in the conference). If conference participant speaks 90% of the time, whenever the system detects this conference participant, it may level the corresponding audio (to the target level) very quickly; whereas if another participant only speaks 7% of the time the system may level the corresponding audio a little more slowly (erring on the side of caution). Another example is reduction of the rate of gain change (toward a target gain for an object) based on how much noise is identified as being associated with the object (e.g., a conference participant). If there is a high noise level coming from (i.e., associated with) an object, the system may set a very low rate of gain change for the object. Or, if there is a low noise level associated with an object, the system may set a rapid rate of gain change for the object.

Aspects of the invention include a system or device configured (e.g., programmed) to perform any embodiment of the inventive method, and a computer readable medium (e.g., a disc) which stores code for implementing any embodiment of the inventive method or steps thereof. For example, the inventive system can be or include a programmable general purpose processor, digital signal processor, or microprocessor, programmed with software or firmware and/or otherwise configured to perform any of a variety of operations on data, including an embodiment of the inventive method or steps thereof. Such a general purpose processor may be or include a computer system including an input device, a memory, and a processing subsystem that is programmed (and/or otherwise configured) to perform an embodiment of the inventive method (or steps thereof) in response to data asserted thereto.

The FIG. 3 system may be implemented as a configurable (e.g., programmable) digital signal processor (DSP) that is configured (e.g., programmed and otherwise configured) to perform required processing on an audio signal (e.g., decoding of the signal to determine time-domain or frequency-domain data asserted to stage 21, and other processing of such decoded frequency-domain data), including performance of an embodiment of the inventive method. Alternatively, the FIG. 3 system) may be implemented as a programmable general purpose processor (e.g., a PC or other computer system or microprocessor, which may include an input device and a memory) which is programmed with software or firmware and/or otherwise configured to perform any of a variety of operations including an embodiment of the inventive method. A general purpose processor configured to perform an embodiment of the inventive method would typically be coupled to an input device (e.g., a mouse and/or a keyboard), a memory, and a display device.

Another aspect of the invention is a computer readable medium (e.g., a disc) which stores code for implementing any embodiment of the inventive method or steps thereof.

While specific embodiments of the present invention and applications of the invention have been described herein, it will be apparent to those of ordinary skill in the art that many variations on the embodiments and applications described herein are possible without departing from the scope of the invention described and claimed herein. For example, examples mentioned herein of time and/or frequency domain processing (and/or time-to-frequency transformation) of signals are intended as examples and are not intended to limit the claims to require any specific type of processing and/or transformation that is not explicit in the claims. It should be understood that while certain forms of the invention have been shown and described, the invention is not to be limited to the specific embodiments described and shown or the specific methods described.

The invention claimed is:

1. A method for adaptive control of gain applied to an audio signal, including the steps of:
   (a) analyzing segments of the signal to identify audio objects indicated by said signal, including by identifying an audio object indicated by each of the segments;
   (b) storing information regarding each distinct audio object identified in step (a), including an identification of the object and a measure of level of each of at least one segment of the signal indicative of the object;
   (c) using at least a subset of the information stored in step (b) to determine, independently for each distinct audio object identified in step (a), target gain and a gain change rate for reaching the target gain for the audio object; and
   (d) applying gain to the segments of the signal indicative of one audio object identified in step (a), such that said gain changes, at the gain change rate for said object, from an initial gain to the target gain for the object, wherein
   at least some of the audio objects are voices of participants in a voice conference, and
   the information stored in step (b) includes a data structure regarding each distinct audio object identified in step (a), said data structure including values indicative of:
      a degree of confidence with which the object is classified as a voice of a conference participant,
      a degree of confidence with which the object is classified as a nuisance;
      a direction measure,
      a distance measure, and
      a percentage of time during the conference in which the object has been active.

2. The method of claim 1, wherein the information stored in step (b) includes a scene description indicative of at least one characteristic of the voice conference, the at least one characteristic including data indicating a type or source of each object, and a location or trajectory of at least one source which emits sound comprising the object.

3. The method of claim 1, also including a step of using at least some of the information stored in step (b) to determine independently the target gain for each distinct audio object identified in step (a), such that application of the target gain for each said audio object to a segment of the audio signal indicative of said object is sufficient to move the measure of level of said segment to an output level for the object, where the output level for the object is determined by a predetermined target level and at least a subset of the information stored in step (b).

4. The method of claim 1, wherein step (d) includes the steps of:
   applying a time-varying gain to segments of the signal indicative of a first audio object, wherein the time-varying gain approaches the target gain for the first audio object at the gain change rate determined in step (c) for said first audio object; and
   applying a second time-varying gain to segments of the signal indicative of a second audio object, wherein the second time-varying gain approaches the target gain for the second audio object at the gain change rate determined in step (c) for said second audio object.

5. The method of claim 1, wherein the gain change rate for each audio object identified with a first confidence as a voice of a conference participant is different from the gain change rate for each audio object which is not identified with the first confidence as a voice of a conference participant.

6. The method of claim 5, wherein the gain change rate for each audio object identified with a first confidence as a voice of a conference participant is greater than the gain change rate for each audio object which is identified with less than the first confidence as a voice of a conference participant.

7. The method of claim 1, wherein the information stored in step (b) is indicative of at least one of: degree of confidence with which each distinct audio object is identified in step (a); or proportion of time that each distinct audio object identified in step (a) has been present in the audio signal.

8. The method of claim 7, wherein the information stored in step (b) is indicative of the proportion of time that each distinct audio object identified in step (a) has been present in the audio signal, and the gain change rate for each audio object identified in step (a) is determined in response to information stored in step (b) which is indicative of the proportion of time that that the audio object has been present in the audio signal.

9. The method of claim 1, wherein each said measure of level is one of an RMS value, an amplitude, a weighted signal level, and a perceptual loudness measure.

10. The method of claim 2, wherein step (b) includes the step of storing an updated target level for said each distinct object, an updated identification of said each distinct object, and an updated scene description, and wherein step (c) includes a step of determining the target gain for said each distinct object in response to the updated target level for the object, the updated identification of the object, and the updated scene description.

11. A system for adaptive control of gain applied to an audio signal, said system including:
   a gain stage coupled and configured to apply gain to the signal, including by applying different amounts of gain to different segments of the signal;
   a signal analysis stage coupled and configured to analyze segments of the signal to identify audio objects indicated by said signal, including by identifying an audio object indicated by each of the segments, wherein the signal analysis stage is configured to store information regarding each distinct identified audio object, said information including an identification of the object and a measure of level of each of at least one segment of the signal indicative of the object; and
   a gain determination stage coupled to the gain stage and to the signal analysis stage and configured to determine, independently for said each distinct identified audio object and in response to at least a subset of the information, a target gain and a gain change rate for reaching the target gain for said audio object, wherein
   at least some of the audio objects are voices of participants in a voice conference, and
   the stored information includes a data structure regarding each distinct identified audio object, said data structure including values indicative of:
      a degree of confidence with which the object is classified as a voice of a conference participant,
      a degree of confidence with which the object is classified as a nuisance;
      a direction measure,
      a distance measure, and
      a percentage of time during the conference in which the object has been active.

12. The system of claim 11, wherein the gain determination stage is configured to operate in a mode to determine gain to be applied by the gain stage to a subset of the segments of the signal, each of the segments in the subset is indicative of one said identified audio object, and the gain determined in said mode changes at the gain change rate for the object, from an initial gain to the target gain for the object.

13. The system of claim 11, wherein the information includes a scene description indicative of at least one characteristic of the voice conference, the at least one characteristic including data indicating a type or source of each object, and a location or trajectory of at least one source which emits sound comprising the object.

14. The system of claim 11, wherein the gain determination stage is coupled and configured to operate in a gain limiting mode in response to an indication from the signal analysis stage that the measure of level of a segment of the signal exceeds a predetermined threshold, wherein the gain determination stage in the gain limiting mode determines a limited gain to be applied by the gain stage to the segment whose measure of level exceeds the predetermined threshold, such that application of the limited gain to said segment generates a gain limited output whose level does not exceed a predetermined maximum level.

15. The system of claim 11, wherein the gain determination stage is configured to determine independently, in response to at least a subset of the stored information, the target gain for each distinct identified audio object, such that application of the target gain for each said audio object to a segment of the audio signal indicative of said object is sufficient to move the measure of level of said segment to an output level for the object, where the output level for the object is determined by a predetermined target level and at least a subset of the information.

16. The system of claim 11, wherein the gain determination stage is configured to determine each said gain change rate such that the gain change rate for each audio object identified by the signal analysis stage with a first confidence as a voice of a conference participant is different from the gain change rate for each audio object which is not identified with the first confidence by the signal analysis stage as a voice of a conference participant.

17. The system of claim 11, wherein the gain determination stage is configured to determine each said gain change rate such that the gain change rate for each audio object identified by the signal analysis stage with a first confidence as a voice of a conference participant is different from the gain change rate for each audio object which is not identified by the signal analysis stage as a voice of a conference participant.

18. The system of claim 11, wherein the signal analysis stage is coupled and configured to generate and store information indicative of at least one of: degree of confidence with which said each distinct identified audio object has been identified; or proportion of time that said each distinct identified audio object has been present in the audio signal.

19. The system of claim 11, wherein the signal analysis stage is configured to store information indicative of proportion of time that said each distinct identified audio object has been present in the audio signal, and the gain determination stage is coupled and configured to determine the gain change rate for said each distinct identified audio object in response to the information indicative of proportion of time that that the audio object has been present in the audio signal.

20. The system of claim 11, wherein said system is a digital signal processor, configured to implement the signal analysis stage, the gain determination stage, and the gain stage.

21. A software program including instructions for executing all steps of the method according to claim 1, when executed on a computer.

* * * * *